United States Patent
Kato et al.

(10) Patent No.: US 6,825,705 B2
(45) Date of Patent: Nov. 30, 2004

(54) CLOCK SIGNAL GENERATION CIRCUIT AND AUDIO DATA PROCESSING APPARATUS

(75) Inventors: Akio Kato, Kawasaki (JP); Masami Iwamoto, Kawasaki (JP); Hirokazu Asami, Kawasaki (JP); Tadahito Miura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/457,560

(22) Filed: Jun. 10, 2003

(65) Prior Publication Data

US 2003/0234672 A1 Dec. 25, 2003

(30) Foreign Application Priority Data

Jun. 21, 2002 (JP) ........................................ 2002-181743

(51) Int. Cl.[7] ................................................. H03K 3/00
(52) U.S. Cl. ........................................ 327/291; 327/294
(58) Field of Search ................................ 327/291, 293, 327/294, 298, 198, 299

(56) References Cited

U.S. PATENT DOCUMENTS

| | | | | |
|---|---|---|---|---|
| 5,999,570 A | * | 12/1999 | Chaki | ........................ 375/281 |
| 6,340,906 B1 | * | 1/2002 | Mizutani | .................... 327/198 |
| 6,421,785 B1 | * | 7/2002 | Gryskiewicz et al. | ........ 713/500 |

* cited by examiner

*Primary Examiner*—Linh My Nguyen
(74) *Attorney, Agent, or Firm*—Staas & Halsey LLP

(57) ABSTRACT

A clock generation apparatus includes a first clock generation circuit which generates a clock signal by making state transition in synchronization with a master clock signal after exiting from a predetermined state in response to a timing signal supplied from an exterior of the apparatus, a counter which counts clock pulses of the master clock signal after exiting from a reset state in response to the timing signal, and a reset circuit which resets the counter and sets the first clock generation circuit in the predetermined state in response to the count of the counter reaching a first predetermined value.

12 Claims, 10 Drawing Sheets

CLOCK SIGNAL GENERATION CIRCUIT AND AUDIO DATA PROCESSING APPARATUS

CROSS-REFERENCE TO RELATED APPLICATIONS

The present application is based upon and claims the benefit of priority from the prior Japanese Patent Application No. 2002-181743 filed on Jun. 21, 2002, with the Japanese Patent Office, the entire contents of which are incorporated herein by reference.

BACKGROUND OF THE INVENTION

1. Field of the Invention

The present invention generally relates to clock signal generation apparatuses, and particularly relates to a clock signal generation apparatus which generates clock signals for the serial transfer of audio data.

2. Description of the Related Art

Methods for the serial transfer of audio data include a method that uses two types of clock signals, one being a bit clock signal for bit-by-bit transmission of data and the other being a word clock signal for switching over the left channel and the right channel of the audio data. In order to generate these audio clock signals, some methods employ a frequency divider and a counter circuit to generate each clock signal based on a master clock signal provided from an external source.

FIG. 1 is a circuit diagram showing an example of a construction of a related-art audio clock generation apparatus. In FIG. 1, a frequency divider is used to generate a bit clock signal, and a counter operates based on the generated bit clock signal to generate a word clock that is an upper bit of the count by the counter.

An audio clock generation circuit 10 of FIG. 1 includes a frequency divider 11, a counter 12, a D-flip-flop 13, a selector 14, a D-flop-flop 15, and an inverter 16. The frequency divider 11 divides the frequency of an audio master clock signal KFS that is provided from an external source, thereby generating a bit clock signal BCKO. The counter 12 receives the bit clock signal BCKO, and counts up in response to each positive transition of the bit clock signal BCKO. The selector 14 selects either the initial count or the current count by the counter 12 where the initial count is predetermined. The selected count is supplied to the counter 12. The counter 12 latches the count by a plurality of flip-flops as the count is supplied from the selector 14, and outputs the latched count after adding one thereto (i.e., +1). This output incremented by 1 is latched via the selector 14 at next timing, thereby achieving counting-up operations. The selector 14 selects the initial count of the counter in the initial state, and selects the count by the counter 12 after an input word clock signal LRCKI exhibits a positive transition. An upper bit of the count by the counter 12 is latched by the D-flop-flop 15 in synchronization with negative transition of the bit clock signal BCKO, followed by being output as the word clock signal LRCKO.

In this manner the bit clock signal BCKO and the word clock signal LRCKO are generated as shown in FIG. 2. The initial value of the counter is set such that the upper bit of the count latched by the D-flop-flop 15 becomes 1 when the count is incremented by 1 after a positive transition of the input word clock signal LRCKI. Accordingly, the word clock signal LRCKO rises immediately after the input word clock signal LRCKI has a positive transmission.

The counter 12 keeps counting by recursively returning to zero, so that the HIGH period and the LOW period of the word clock signal LRCKO each being a predetermined duration are alternated. In the related-art configuration shown in FIG. 1, the word clock signal LRCKO is synchronized at the time the input word clock signal LRCKI first rises to HIGH. Thereafter, alternation of the HIGH period and the LOW period of the word clock signal LRCKO is controlled by the timing of the bit clock signal generated by the frequency divider 11. In this manner, the timing of the word clock signal LRCKO is independent of the changes of the input word clock signal LRCKI, except for its initial setting.

In the related-art construction as described above, a displacement in the positive transition of the input word clock signal LRCKI will result in the input word clock signal LRCKI and the word clock signal LRCKO being displaced relative to each other in terms of their phases. In order to obviate this, the counter may be reset by hardware resetting or software resetting triggered from the exterior, thereby reestablishing the synchronization of the clock generation so as to correct the phase displacement. In this case, however, there is a need to trigger hardware resetting or software resetting from the exterior of the device by detecting the timing displacement of the input word clock signal LRCKI. This requires complex control and large circuit size.

Accordingly, there is a need for a clock signal generation apparatus which can generate a word clock signal that follows timing changes, without requiring externally triggered hardware resetting or software resetting.

SUMMARY OF THE INVENTION

It is a general object of the present invention to provide a clock signal generation apparatus that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a clock signal generation apparatus particularly pointed out in the specification in such full, clear, concise, and exact terms as to enable a person having ordinary skill in the art to practice the invention.

To achieve these and other advantages in accordance with the purpose of the invention, the invention provides a clock generation apparatus, including a first clock generation circuit which generates a clock signal by making state transition in synchronization with a master clock signal after exiting from a predetermined state in response to a timing signal supplied from an exterior of the apparatus, a counter which counts clock pulses of the master clock signal after exiting from a reset state in response to the timing signal, and a reset circuit which resets the counter and sets the first clock generation circuit in the predetermined state in response to the count of the counter reaching a first predetermined value.

In the clock generation apparatus as described above, the first clock generation circuit and the counter are set and reset, respectively, in response to the count reaching the predetermined value, and, then, start operating by exiting from the set state and the reset state, respectively, in response to the timing signal supplied from the exterior.

Accordingly, the first clock generation circuit and the counter are set and reset, respectively, upon the completion of counting the clock pulses of the master clock signal as many as the count corresponds to the duration of the L channel and R channel, and an operation that generates the clock signal can be started by exiting from the set state and the reset state in response to the input word clock signal LRCKI. This makes it possible to generate an output clock signal that follows timing changes of the input word clock signal LRCKI.

According to another aspect of the invention, the clock generation circuit as described above further includes a second clock generation circuit which generates another clock signal by making state transition in synchronization with the master clock signal after exiting from a reset state in response to the timing signal.

In the clock generation circuit as described above, the first and second clock generation circuits are sued to generate a word clock signal and a bit clock signal that follow timing changes of the input word clock signal LRCKI.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 3A:
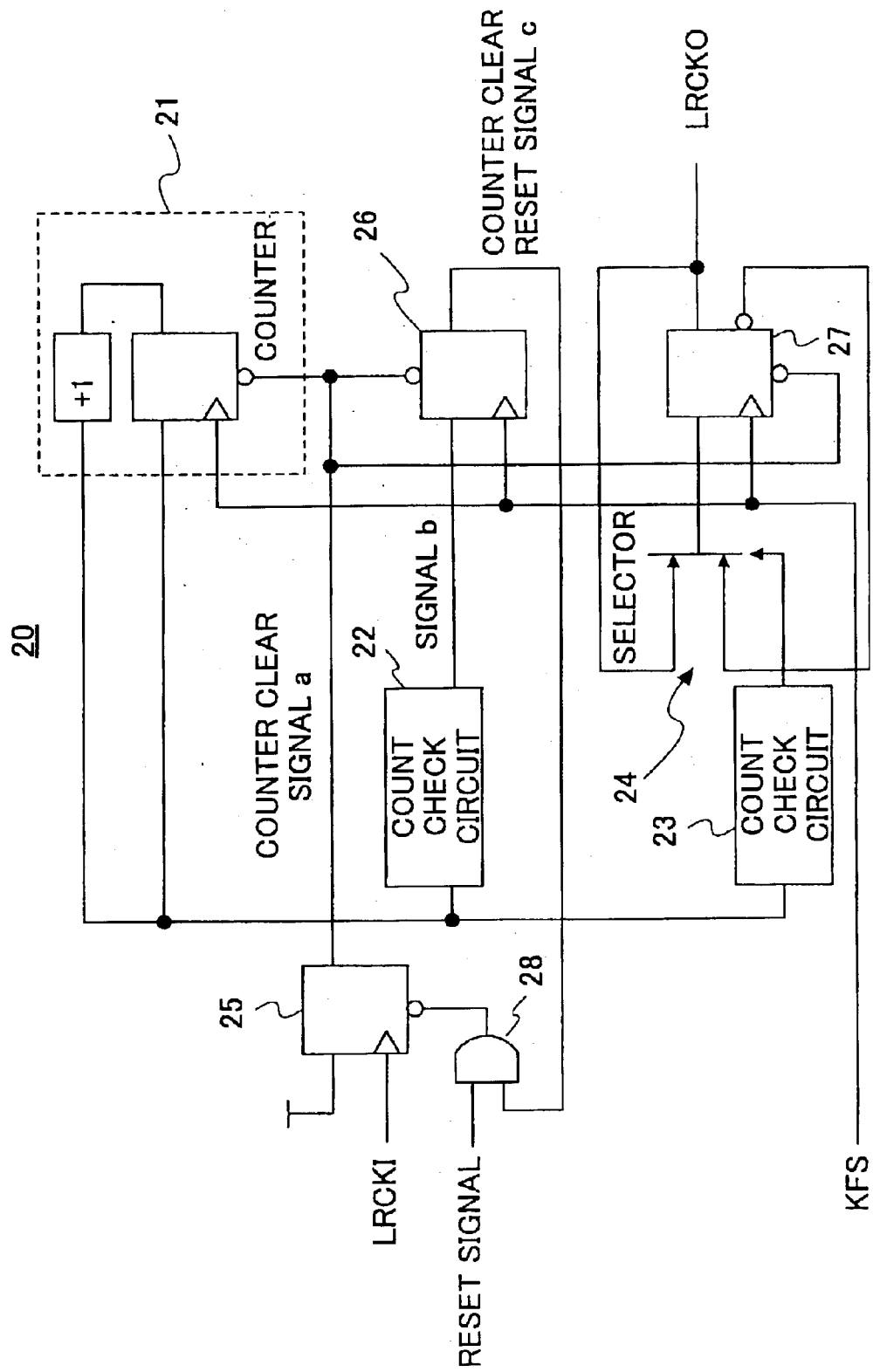
FIGS. 3A and 3B are circuit diagrams showing a first embodiment of a clock signal generation apparatus according to the present invention.
Figure 3B:
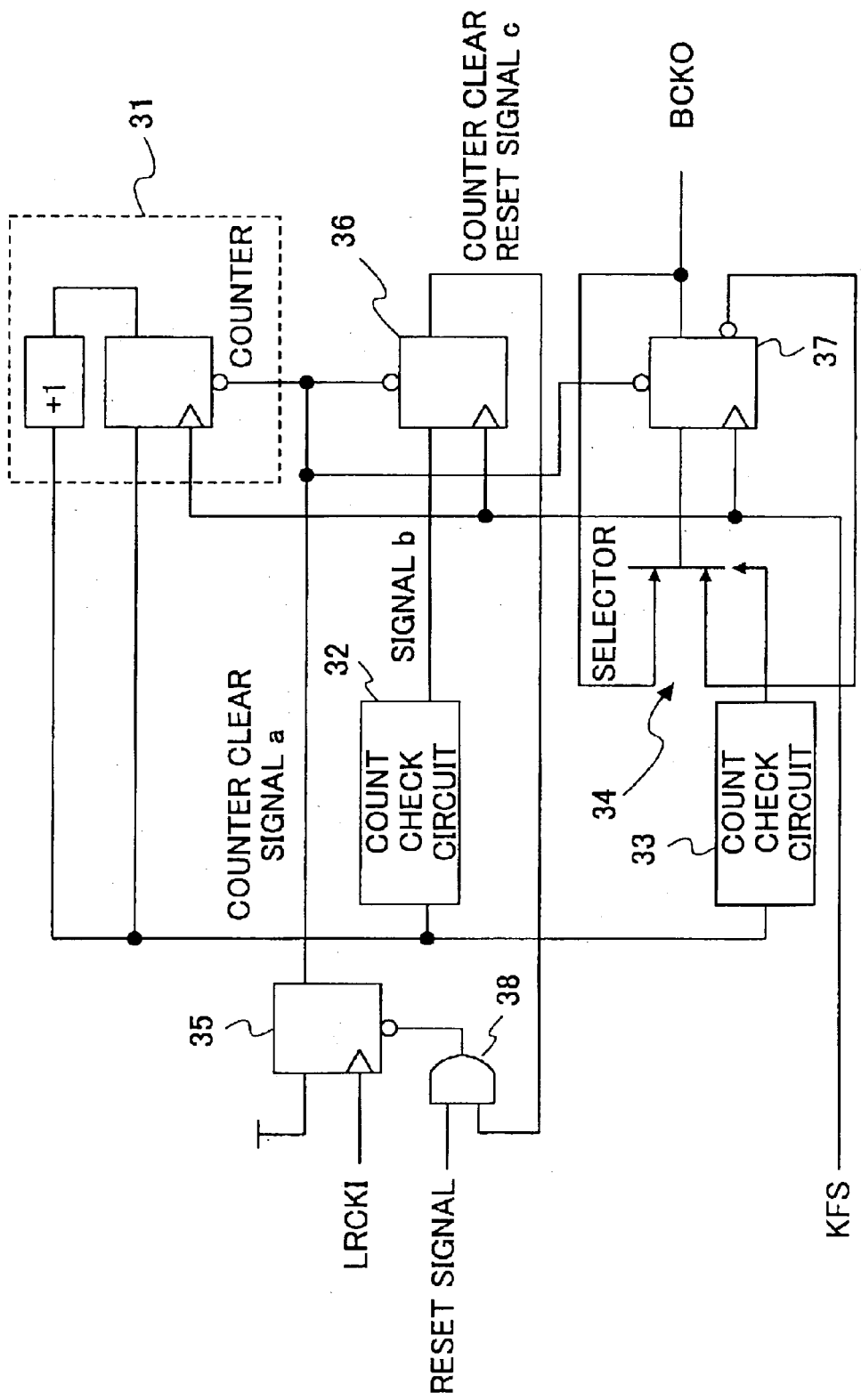

FIGS. 3A and 3B are circuit diagrams showing a first embodiment of a clock signal generation apparatus according to the present invention.

An audio clock signal generation apparatus 20 of FIG. 3A includes a counter 21, a count check circuit 22, a count check circuit 23, a selector 24, D-flip-flops 25 through 27, and an AND gate 28. In the audio clock signal generation apparatus 20 of FIG. 3A, the operating state and suspended state of the counter 21 are controlled by a counter clear signal a such that the word clock signal LRCKO follows a displacement of the input word clock signal LRCKI at each cycle.

An audio clock signal generation apparatus 30 of FIG. 3B includes a counter 31, a count check circuit 32, a count check circuit 33, a selector 34, D-flip-flops 35 through 37, and an AND gate 38. In the audio clock signal generation apparatus 30 of FIG. 3B, the operating state and suspended state of the counter 31 are controlled by a counter clear signal a such that the bit clock signal BCKO follows a displacement of the input word clock signal LRCKI at each cycle.

Figure 4:
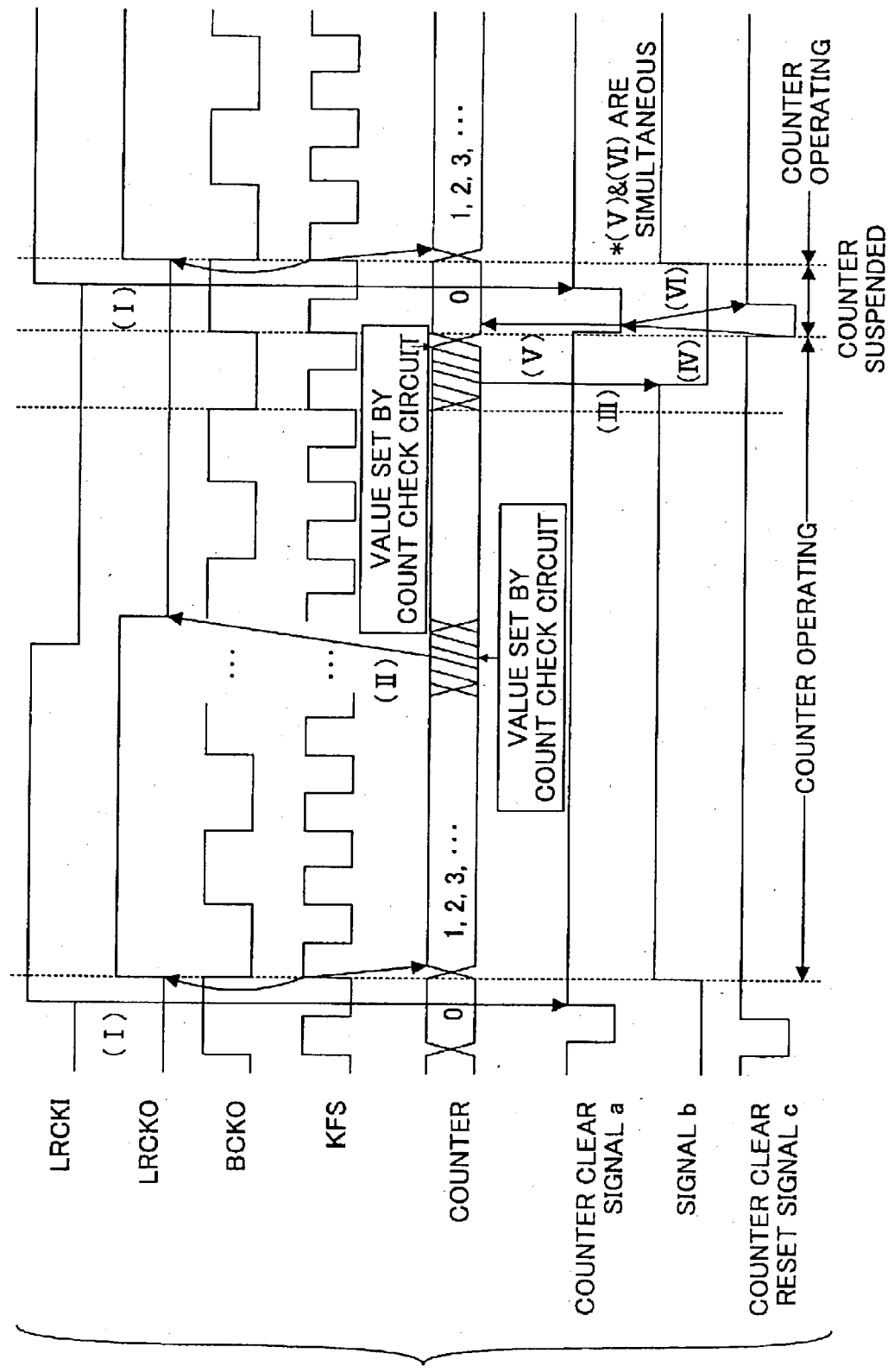
FIG. 4 is a timing chart for explaining the operations of audio clock signal generation apparatuses.

FIG. 4 is a timing chart for explaining the operations of the audio clock signal generation apparatuses. Since the audio clock signal generation apparatus 20 and the audio clock signal generation apparatus 30 have an almost identical construction, the operation of the audio clock signal generation apparatus 20 will first be described in detail.

In the counter operating state, the counter clear signal a that is output from the D-flip-flop 25 changes to HIGH in response to a positive transition of the input word clock signal LRCKI that is input into the D-flip-flop 25. In response, the counter 21 is changed from the reset state to the operating state, thereby starting counting the rising edges of the master clock signal KFS from an immediately following rising edge. In the same manner, the D-flip-flop 27 is also changed from the reset state to the operating state. As a result, the word clock signal LRCKO rises to HIGH in response to the immediately following rising edge of the master clock signal KFS. Further, the change to HIGH of the counter clear signal a puts an end to the preset state of the D-flip-flop 26. The D-flip-flop 26 captures a HIGH signal b at a following rising edge of the master clock signal KFS, so that a reset signal c for resetting the counter clear signal maintains its HIGH level thereafter.

The operations as described above are shown in FIG. 4 as the change to HIGH (I) of the counter clear signal a and changes of respective signals responding to the following rising edge of the master clock signal KFS.

The counter 21 counts up in response to the positive transitions of the master clock signal KFS. The count check circuit 23 changes its output when the count of the counter 21 reaches a predetermined value. In response, the selector 24 changes its selection state, resulting in the selection of the inverted output of the D-flip-flop 27 rather than the LRCKO output of the D-flip-flop 27. When the count by the counter 21 reaches the predetermined value, thus, the word clock signal LRCKO is inverted to change from HIGH to LOW. Here, the HIGH period of the word clock signal LRCKO corresponds to the L channel that carries the left-hand-side audio data, and the LOW period of the word clock signal LRCKO corresponds to the R channel that carries the right-hand-side audio data.

The operations described above are shown in FIG. 4 as the reaching (II) of the count to the predetermined value and the change from HIGH to LOW of the word clock signal LRCKO responding thereto.

The counter 21 further keeps counting the rising edges of the master clock signal KFS. The count check circuit 22 changes its output signal b from HIGH to LOW when the count by the counter 21 reaches a predetermined count value. In response to a following positive transition of the master clock signal KFS, the D-flip-flop 26 captures the LOW level of the signal b, thereby changing the counter clear reset signal c to LOW. As the counter clear reset signal c turns to LOW, the output of the AND gate 28 turns to LOW, thereby resetting the D-flip-flop 25. As a result, the counter clear signal a that is output from the D-flip-flop 25 changes to LOW. The change to LOW of the counter clear signal a resets the counter 21 and the D-flip-flop 27. Further, the D-flip-flop 26 is set so as to return the counter clear reset signal c to HIGH. This puts an end to the reset state of the D-flip-flop 25, which is thus ready to synchronize with a positive transition of the input word clock signal LRCKI that will thereafter arrive.

The operations described above are shown in FIG. 4 as the count by the count check circuit 22 reaching the predetermined count value, the change (III) from HIGH to LOW of the signal b responding thereto, the change to LOW of the counter clear reset signal c responding to the following positive transition of the master clock signal KFS, the change (IV) to LOW of the counter clear signal a responding thereto, the resetting (V) of the counter 21 by the counter clear signal a, and the change to HIGH of the counter clear reset signal c responding to the counter clear signal a.

With the generation of the word clock signal LRCKO defining the L channel and the R channel, the count reaches the predetermined count value as described above, resulting in the counter 21 being reset to lapse into a suspended state, which makes it ready to start another counting. Further, the D-flip-flop 25 falls into a standby state, which makes it ready to respond to a positive transition of the input word clock signal LRCKI. When a positive transition of the input word clock signal LRCKI arrives, the counter clear signal a changes to HIGH in synchronization with this positive transition, which puts an end to the reset state to start another counting, with the word clock signal LRCKO being changed to HIGH.

The audio clock signal generation apparatus 30 of FIG. 3B has an almost identical construction to the audio clock signal generation apparatus 20 of FIG. 3A. As a difference, the counter clear signal a is coupled to the preset input of the D-flip-flop 37 that serves to output the bit clock signal. In response to a positive transition of the input word clock signal LRCKI, thus, the bit clock signal BCKO starts from its negative transition.

The bit clock signal BCKO is a pulse train used for the serial transfer of audio data, and needs to have clock pulses as many as there are data items for serial transfer. Through the same operation as the audio clock signal generation apparatus 20 of FIG. 3A, the count reaches a predetermined count value while generating the bit clock pulses that correspond to the respective periods of the L channel and the R channel, which results in the counter 31 being reset to lapse into a suspended state, thereby making it ready for another counting. Further, the D-flip-flop 35 is placed in a standby state, which makes it ready to respond to a positive transition of the input word clock signal LRCKI. When a positive transition of the input word clock signal LRCKI arrives, the counter clear signal a changes to HIGH in synchronization with this positive transition, which puts an end to the reset state to start another counting, with the supply of the bit clock signal BCKO being resumed.

Figure 5:
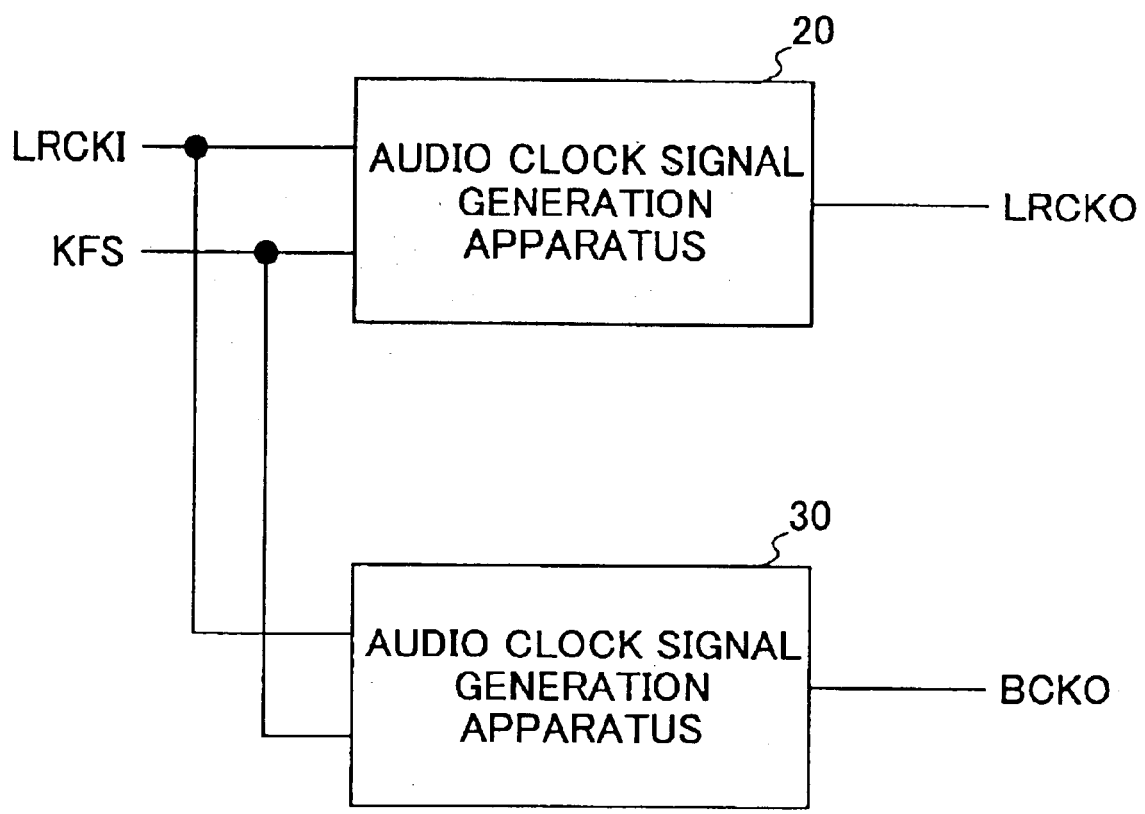
FIG. 5 is a block diagram showing a configuration in which the two audio clock signal generation apparatuses are used together.

FIG. 5 is a block diagram showing a configuration in which the audio clock signal generation apparatus 20 and the audio clock signal generation apparatus 30 are used together.

As shown in FIG. 5, the input word clock signal LRCKI and the master clock signal KFS are supplied to both the audio clock signal generation apparatus 20 and the audio clock signal generation apparatus 30. This makes it possible to simultaneously generate the word clock signal LRCKO and the bit clock signal BCKO that are in synchronization with the input word clock signal LRCKI and the master clock signal KFS and that are corrected at each cycle of the input word clock signal LRCKI.

In the following, a description will be given with regard to an operation by which the word clock signal LRCKO and the bit clock signal BCKO follow the timing changes of the input word clock signal LRCKI.

Figure 6:
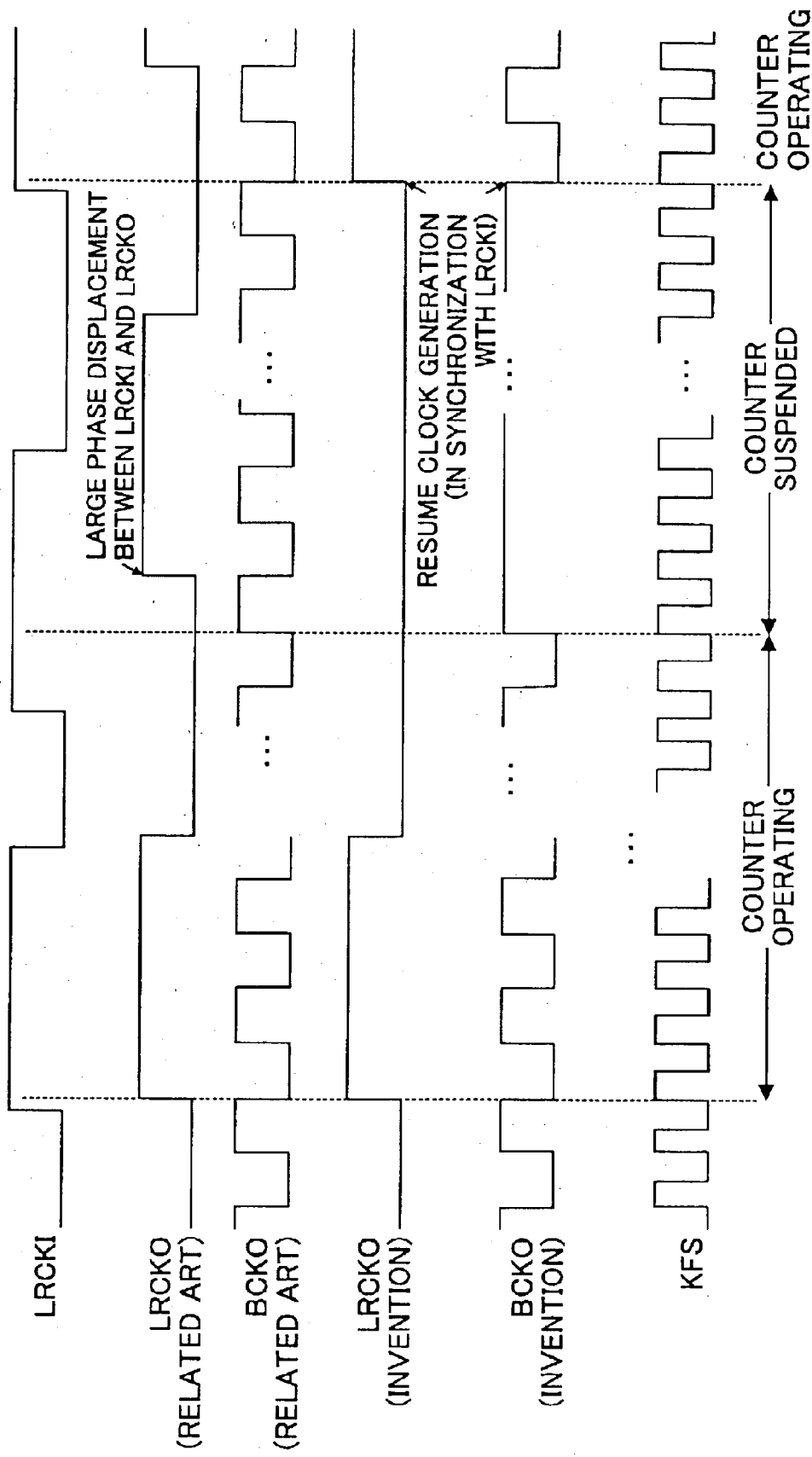
FIG. 6 is a timing chart showing a case in which an input word clock signal rises to HIGH earlier than its usual timing.

FIG. 6 is a timing chart showing a case in which the input word clock signal LRCKI rises to HIGH earlier than its usual timing.

Among the rising edges of the input word clock signal LRCKI shown in FIG. 6, the second rising edge is earlier than its usual timing. In this example, the input word clock signal LRCKI rises to HIGH before the counts by the counters 21 and 31 reach the respective count settings of the count check circuits 22 and 32. Since the counter clear signal a remains HIGH, circuit operations will not be affected by this positive transition of the input word clock signal LRCKI. The counters 21 and 31 keep counting, and come to a halt at the respective predetermined count values. Since this halting occurs after the second rising edge of the input word clock signal LRCKI, counting will not be resumed for a while. Further, since resetting by the counter clear signal a occurs after the second rising edge of the input word clock signal LRCKI, LRCKO will not rise to HIGH for a while. Moreover, the bit clock signal BCKO will be kept in the suspended state for a while.

Figure 1:
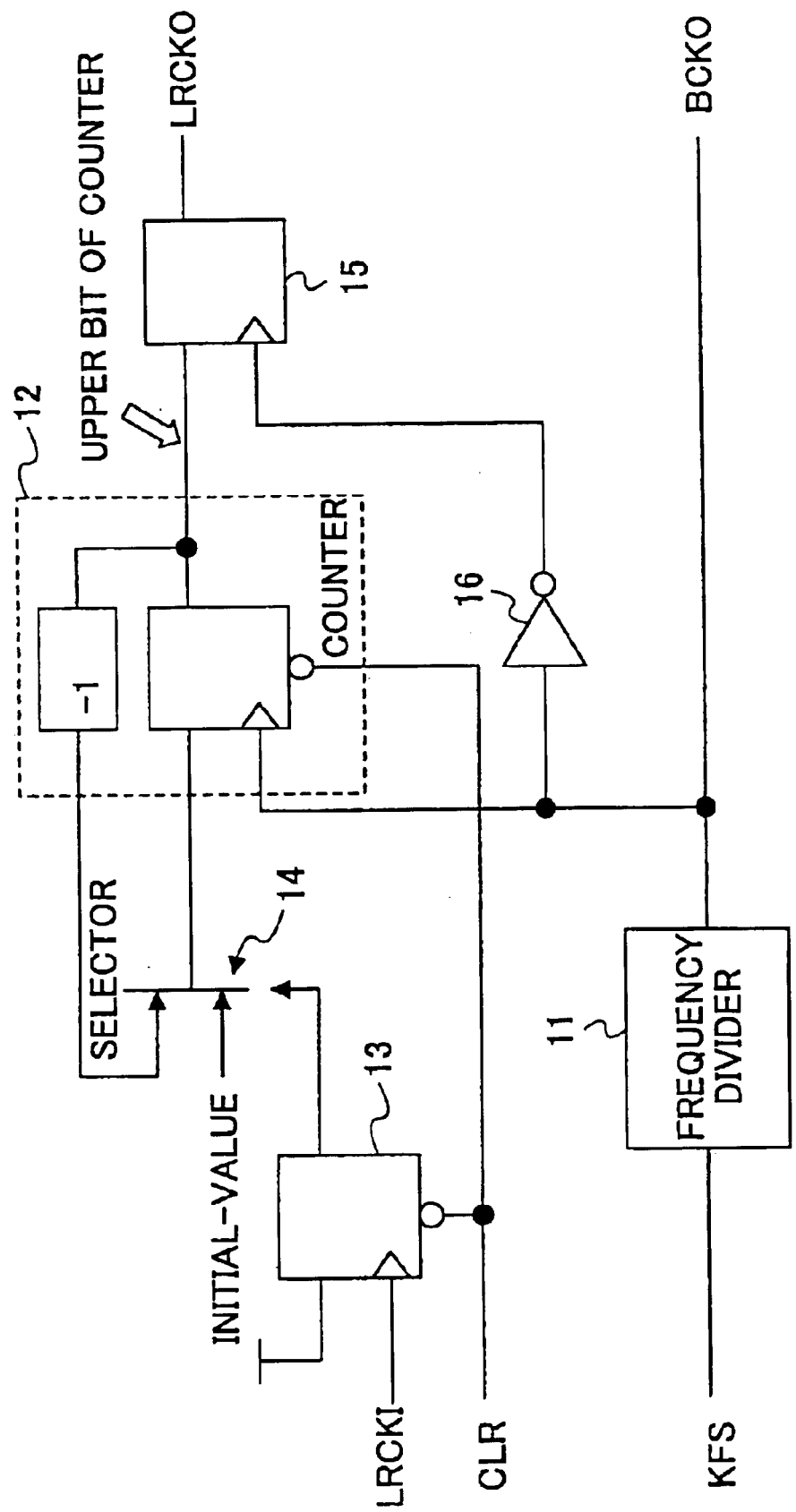
FIG. 1 is a circuit diagram showing an example of a construction of a related-art audio clock generation apparatus.
Figure 2:
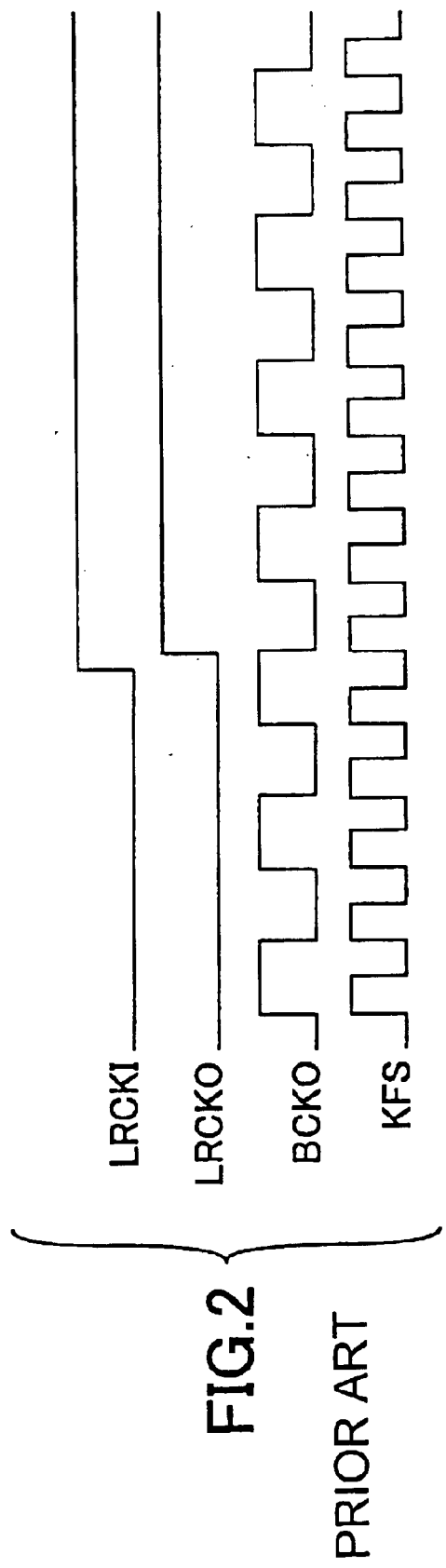
FIG. 2 is a timing chart showing a bit clock signal and a word clock signal.

After this, the third rising edge of the input word clock signal LRCKI arrives, and, the counters 21 and 31 start counting in response. In response to this rising edge of the input word clock signal LRCKI, further, the word clock signal LRCKO changes to HIGH, and the supply of the bit clock signal BCKO is resumed. Accordingly, the word clock signal LRCKO and the bit clock signal BCKO follow the timing change of the input word clock signal LRCKI as far as the third rising edge of the input word clock signal LRCKI is concerned. FIG. 6 additionally illustrates related-art operations. With the related-art construction as shown in FIG. 1, the word clock signal LRCKO and the bit clock signal BCKO are generated at fixed timing, and fail to follow timing changes of the input word clock signal LRCKI.

Figure 7:
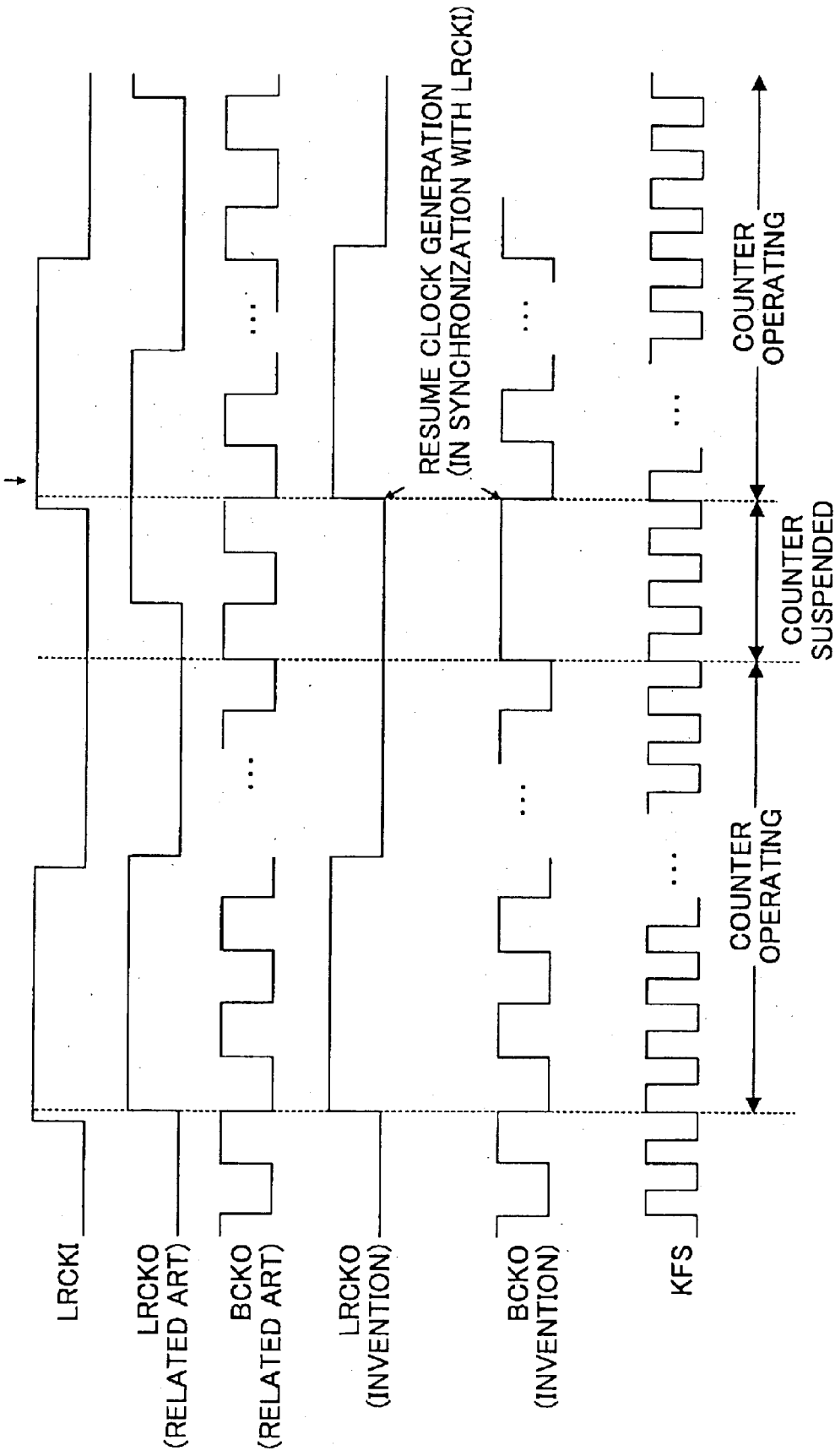
FIG. 7 is a timing chart showing a case in which the input word clock signal rises to HIGH later than its usual timing.

FIG. 7 is a timing chart showing a case in which the input word clock signal LRCKI rises to HIGH later than its usual timing.

Among the rising edges of the input word clock signal LRCKI shown in FIG. 7, the second rising edge is later than its usual timing. Since the counters 21 and 31 are in the suspended state and ready to respond, the counters 21 and 31 start counting when the second rising edge of the input word clock signal LRCKI arrives at the delayed timing. In response to this rising edge of the input word clock signal LRCKI, further, the word clock signal LRCKO changes to HIGH, and the supply of the bit clock signal BCKO is resumed. Accordingly, the word clock signal LRCKO and the bit clock signal BCKO follow the timing change of the second rising edge of the input word clock signal LRCKI that arrives at the delayed timing. With the related-art construction as shown in FIG. 1, on the other hand, the word clock signal LRCKO and the bit clock signal BCKO are generated at fixed timing, and fail to follow timing changes of the input word clock signal LRCKI.

According to the present invention as described above, the circuitry is reset to bring the count to its initial value after the clocks are generated for the predetermined durations of the L channel and the R channel. In response to the input word clock signal LRCKI that is provided from the exterior of the device, counting is restarted, with the word clock signal being changed to HIGH and the supply of the bit clock signal being resumed. This makes it possible to generate the word clock signal in synchronization with the input word clock signal LRCKI at each cycle of the input word clock signal LRCKI, and also makes it possible to reliably generate the bit clock signal without failing to provide a required number of clock pulses. Reliable data transfer is thus achieved.

Figure 8:
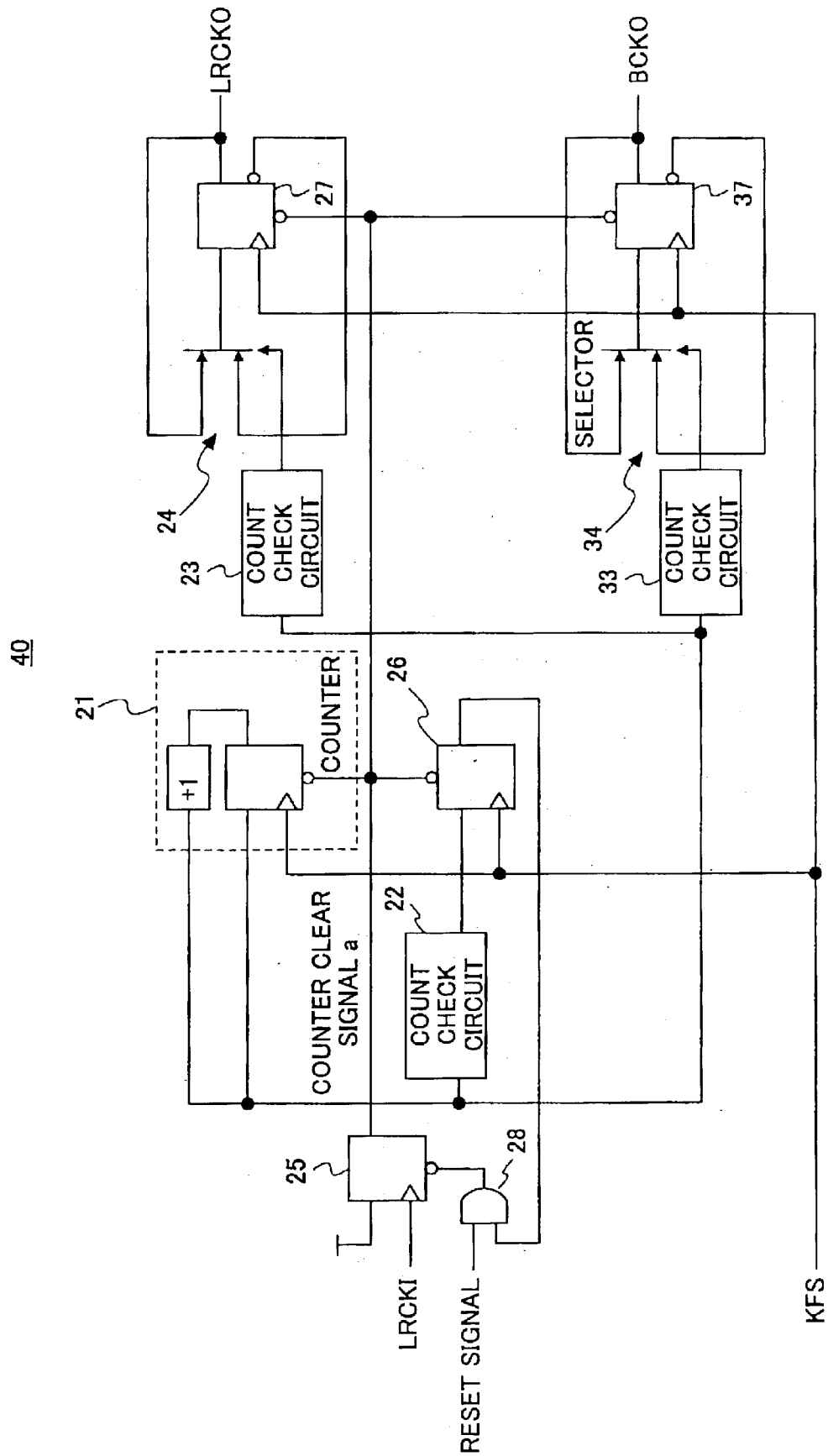
FIG. 8 is a circuit construction in which some circuit elements are shared by the two audio clock signal generation apparatuses shown in FIGS. 3A and 3B.

FIG. 8 is a circuit construction in which some circuit elements are shared by the audio clock signal generation apparatus 20 and the audio clock signal generation apparatus 30 shown in FIGS. 3A and 3B.

When the audio clock signal generation apparatus 20 and the audio clock signal generation apparatus 30 are used together to generate the word clock signal and the bit clock signal, the count values set in the count check circuits 22 and 32 represent a count at which counting comes to an end at the end of the L channel period and at the end of the R channel period. The count settings are the same in these two count check circuits. The count check circuit 22 can thus be shared. Further, the counter 21, the D-flip-flops 25 and 26, and the AND gate 28 can be shared as shown in FIG. 8.

Accordingly, an audio clock signal generation apparatus 40 of FIG. 8 has a reduced circuit size, compared to the construction in which the audio clock signal generation apparatus 20 and the audio clock signal generation apparatus 30 are provided alongside as shown in FIG. 5.

Figure 9:
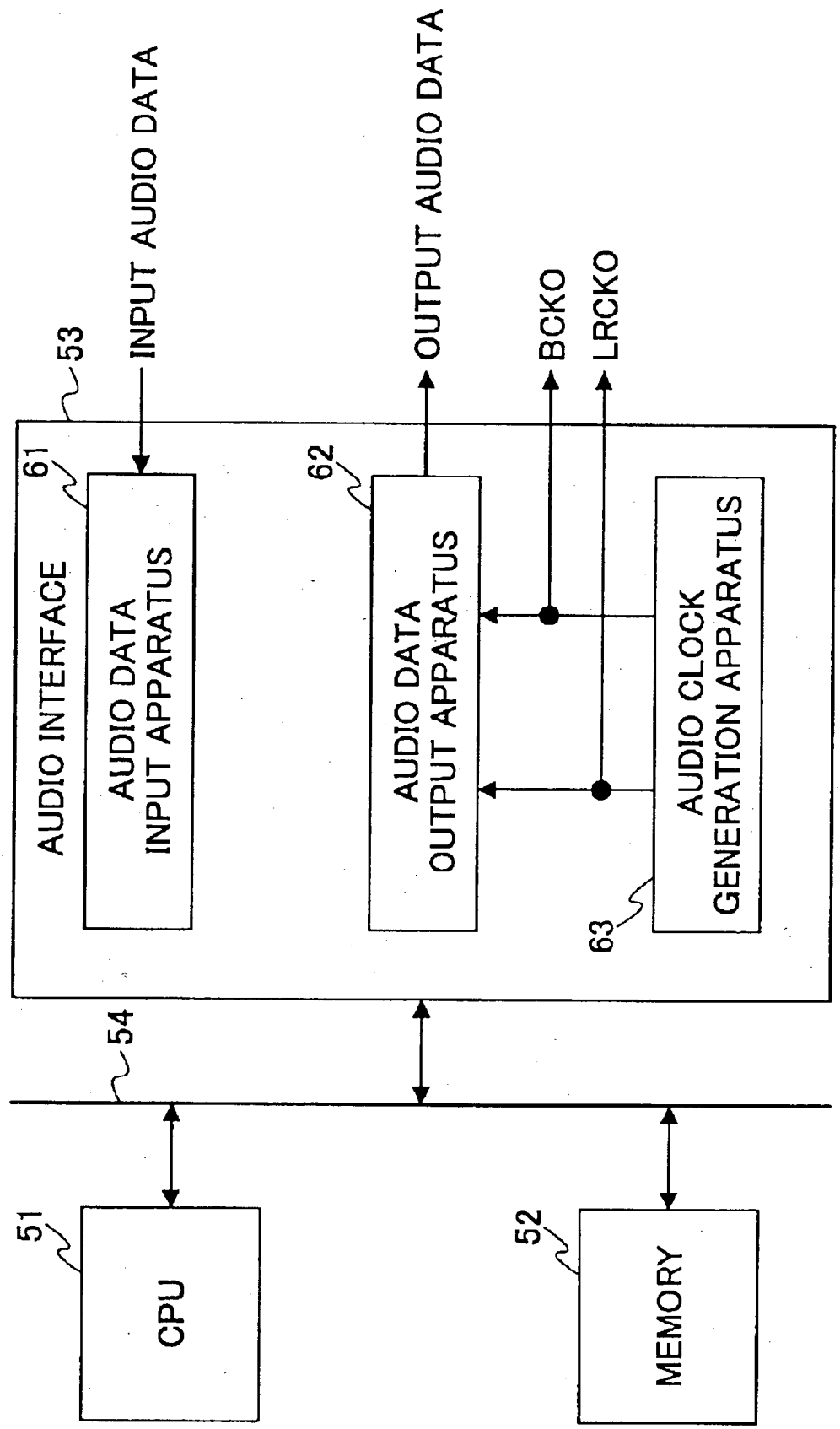
FIG. 9 is a block diagram showing a construction of an audio processing apparatus according to the present invention.

FIG. 9 is a block diagram showing a construction of an audio processing apparatus according to the present invention.

The audio processing apparatus of FIG. 9 includes a CPU 51, a memory 52, an audio interface 53, and a bus 54. The CPU 51, the memory 52, and the audio interface 53 are connected to each other via the bus 54. The audio interface 53 includes an audio data input apparatus 61, an audio data output apparatus 62, and an audio clock generation apparatus 63. The audio clock generation apparatus 63 has the construction as shown in FIG. 8. Alternatively, the audio clock generation apparatus as shown in FIG. 5 may be used.

The audio data input apparatus 61 receives audio input data from the exterior of the apparatus, and supplies the received data to the memory 52 for storage therein, for example. Data processed by the CPU 51 or stored in the memory 52 are supplied to the audio data output apparatus 62 via the bus 54, and are output to the exterior of the apparatus from the audio data output apparatus 62. The timing at which the audio data output apparatus 62 receives and captures the audio data from the bus 54 is controlled by the word clock signal LRCKO and the bit clock signal BCKO generated by the audio clock generation apparatus 63, and so is the timing at which the audio data output apparatus 62 serially transmits the audio data to the exterior of the apparatus.

The word clock signal LRCKO serves to discriminate between the L channel and the R channel, and the bit clock signal BCKO is used to transfer each data bit of the audio data. The word clock signal LRCKO and the bit clock signal BCKO are supplied to the exterior of the apparatus as output clock signals, thereby making it possible for the receiver side to use these clock signals as well.

Further, the present invention is not limited to these embodiments, but various variations and modifications may be made without departing from the scope of the present invention.

What is claimed is:

1. A clock generation apparatus, comprising:
 a first clock generation circuit which generates a clock signal in synchronization with a master clock signal in response to a timing signal supplied from an exterior of the apparatus;
 a counter which counts clock pulses of the master clock signal in response to the timing signal; and
 a reset circuit which resets said counter and sets said first clock generation circuit in a predetermined state in response to the count of the counter reaching a first predetermined value.

2. The clock generation apparatus as claimed in claim 1, wherein said first clock generation circuit inverts the clock signal in synchronization with the master clock signal in response to the count of the counter reaching a second predetermined value.

3. The clock generation apparatus as claimed in claim 2, wherein said first clock generation circuit includes:
 a flip-flop which has a positive logic output and an inverted logic output;
 a count check circuit which detects the count of the counter reaching the second predetermined value; and
 a selector which selects one of the positive logic output and the inverted logic output according to an output of said count check circuit, and supplies the selected one to said flip-flop.

4. The clock generation apparatus as claimed in claim 1, further comprising a count check circuit which detects an event that the count reaches the first predetermined value, and notifies said reset circuit of the detection of the event.

5. The clock generation apparatus as claimed in claim 1, further comprising a second clock generation circuit which generates another clock signal by making state transition in synchronization with the master clock signal after exiting from a reset state in response to the timing signal.

6. The clock generation apparatus as claimed in claim 5, wherein the clock signal generated by said first clock generation circuit is changed only once between HIGH and LOW from a time the count starts to a time the count reaches the first predetermined value, and said another clock signal generated by said second clock generation circuit has a cycle that is N (N: integer) times as long as a cycle of the master clock signal.

7. An audio data processing apparatus, comprising:
 a first clock generation circuit which generates a clock signal by making state transition in synchronization with a master clock signal after exiting from a predetermined state in response to a timing signal supplied from an exterior of the apparatus;
 a counter which counts clock pulses of the master clock signal after exiting from a reset state in response to the timing signal;
 a reset circuit which resets said counter and sets said first clock generation circuit in said predetermined state in response to the count of the counter reaching a predetermined value; and
 an audio data outputting circuit which outputs audio data to an exterior of the apparatus based on the clock signal generated by said first clock generation circuit.

8. The audio data processing apparatus as claimed in claim 7, further comprising a second clock generation circuit which generates another clock signal by making state transition in synchronization with the master clock signal after exiting from a reset state in response to the timing signal, wherein said audio data outputting circuit outputs the audio data to the exterior of the apparatus based on the clock signal generated by said first clock generation circuit and said another clock signal generated by said second clock generation circuit.

9. The audio data processing apparatus as claimed in claim 8, wherein the clock signal generated by said first clock generation circuit is changed only once between HIGH and LOW from a time the count starts to a time the count reaches the predetermined value, and said another clock signal generated by said second clock generation circuit has a cycle that is N (N: integer) times as long as a cycle of the master clock signal.

10. The audio data processing apparatus as claimed in claim 8, further comprising:
   a CPU;
   a memory; and
   a bus which provides connections between said CPU, said memory, and said audio data outputting circuit,
   wherein said audio data outputting circuit receives the audio data from said bus based on the clock signal generated by said first clock generation circuit and said another clock signal generated by said second clock generation circuit.

11. A clock generation apparatus as recited in claim 1, wherein the first clock generation circuit generates the clock signal by making a state transition in synchronization with the master clock signal after exiting from the predetermined state in response to the timing signal.

12. The clock generation apparatus as claimed in claim 1, wherein the counter counts clock pulses of the master clock signal after exiting from the reset state in response to the timing signal.

* * * * *